United States Patent
Miyagi et al.

(10) Patent No.: US 11,137,741 B2
(45) Date of Patent: Oct. 5, 2021

(54) QUALITY CONTROL DEVICE AND QUALITY CONTROL METHOD

(71) Applicant: Hitachi, Ltd., Tokyo (JP)

(72) Inventors: Masanori Miyagi, Tokyo (JP); Yoshiyuki Takamori, Tokyo (JP); Seunghwan Park, Tokyo (JP)

(73) Assignee: HITACHI, LTD., Tokyo (JP)

( * ) Notice: Subject to any disclaimer, the term of this patent is extended or adjusted under 35 U.S.C. 154(b) by 32 days.

(21) Appl. No.: 16/466,871

(22) PCT Filed: Nov. 8, 2017

(86) PCT No.: PCT/JP2017/040307
§ 371 (c)(1),
(2) Date: Jun. 5, 2019

(87) PCT Pub. No.: WO2018/105296
PCT Pub. Date: Jun. 14, 2018

(65) Prior Publication Data
US 2019/0317476 A1 Oct. 17, 2019

(30) Foreign Application Priority Data
Dec. 7, 2016 (JP) .............................. JP2016-237567

(51) Int. Cl.
*G05B 19/418* (2006.01)
*H05K 13/08* (2006.01)
(Continued)

(52) U.S. Cl.
CPC ........... *G05B 19/418* (2013.01); *H05K 3/341* (2013.01); *H05K 13/083* (2018.08);
(Continued)

(58) Field of Classification Search
CPC ........ G05B 19/418; G05B 2219/32194; G05B 2219/32368; H05K 13/083
See application file for complete search history.

(56) References Cited

U.S. PATENT DOCUMENTS

2006/0047454 A1* 3/2006 Tamaki ................. G06Q 10/06
702/84
2010/0100218 A1* 4/2010 Weinzierl ............. C21D 11/005
700/104
(Continued)

FOREIGN PATENT DOCUMENTS

EP 3119176 A1 1/2017
JP 2008-152341 A 7/2008
(Continued)

OTHER PUBLICATIONS

Akira, JP2008152341, 2008, English Translation (Year: 2008).*
(Continued)

*Primary Examiner* — Mohammad Ali
*Assistant Examiner* — Vincent W Chang
(74) *Attorney, Agent, or Firm* — Foley & Lardner LLP

(57) ABSTRACT

In order to realize stable quality control, provided is a quality control device (1) having an input device which receives data such as an operation condition of each device (21) to (26) in a production system (20) for producing a product; a calculation unit which assigns a value of the operation condition to a correlation formula calculated in advance and calculates a value derived from the correlation formula; and a determination unit which performs good or bad determination on a quality of a workpiece in each process, on the basis of a result calculated by the calculation unit. Further, when "bad" is determined as a result of the good or bad determination, the quality control device (1) calculates an appropriate value of the operation condition and sets the value to each device (21) to (26).

9 Claims, 11 Drawing Sheets

(51) Int. Cl.
 *H05K 3/34* (2006.01)
 *H05K 1/02* (2006.01)
(52) U.S. Cl.
 CPC ......... *H05K 13/089* (2018.08); *H05K 1/0269* (2013.01); *H05K 3/3494* (2013.01); *H05K 2203/163* (2013.01)

(56) References Cited

U.S. PATENT DOCUMENTS

2017/0123411 A1\* 5/2017 Cheng .............. G05B 19/41875
2018/0284739 A1\* 10/2018 Ueda ................ G05B 19/41875
2019/0160755 A1\* 5/2019 Blasco .................. B33Y 50/02

FOREIGN PATENT DOCUMENTS

| JP | 2009-080649 A | 4/2009 |
| JP | 2009-099960 A | 5/2009 |
| JP | 2015-153914 A | 8/2015 |

OTHER PUBLICATIONS

International Search Report with English translation and Written Opinion issued in corresponding application No. PCT/JP2017/040307 dated Jan. 30, 2018.
Office Action issued in corresponding Chinese Patent Application No. 201780074883.2 dated Jun. 29, 2021 with English translation.

\* cited by examiner

| DESIGN | | ENVIRONMENT | PROCESS | | | | | |
|---|---|---|---|---|---|---|---|---|
| DESIGN | PROCESS | ENVIRONMENT | RECEPTION | HEAT TREATMENT | CLEANING | PRESS FITTING | WELDING | INSPECTION (QUALITY) |
| DRAWING a | METHOD b | TEMPERATURE 1 | MATERIAL ROD 2 | TEMPERATURE 3 | SOLUTION CLEANING DEGREE 4 | LOAD 5 | DIMENSION 6 | PERFORMANCE 7 |
| PART a | FACILITY b | HUMIDITY 1 | COMPONENT 2 | COOLING RATE 3 | OIL AMOUNT 4 | PRESSING AMOUNT 5 | MOLTEN POOL SHAPE 6 | VISUAL OBSERVATION 7 |
| DIMENSION a | CONDITION b | AIR VOLUME 1 | DIMENSION 2 | ATMOSPHERE 3 | DEVICE OPERATION 4 | OIL AMOUNT 5 | MOLTEN POOL LIGHT EMISSION 6 | SHAPE 7 |
| MATERIAL a | | | CLEANING DEGREE 2 | DEVICE OPERATION 3 | WORKER 4 | DIMENSION 5 | OPTICAL SYSTEM 6 | DEVICE OPERATION 7 |
| TOLERANCE a | | | HARDNESS 2 | WORKER 3 | CLEANING QUALITY 4 | DEVICE OPERATION 5 | OIL AMOUNT 6 | WORKER 7 |
| SPECIFICATION a | | | | HEAT TREATMENT QUALITY 3 | | WORKER 5 | DEVICE OPERATION 6 | |
| PRODUCTION PROCESS a | | | | | | PRESS FITTING QUALITY 5 | WORKER 6 | |
| | | | | | | | WELDING QUALITY 6 | |

| ENVIRONMENT | | RECEPTION | | HEAT TREATMENT | |
|---|---|---|---|---|---|
| TEMPERATURE 1 | — | MATERIAL ROD 2 | PRESENT | TEMPERATURE 3 | PRESENT |
| HUMIDITY 1 | — | COMPONENT 2 | PRESENT | COOLING RATE 3 | PRESENT |
| AIR VOLUME 1 | — | DIMENSION 2 | — | ATMOSPHERE 3 | PRESENT |
| | | CLEANING DEGREE 2 | PRESENT | DEVICE OPERATION 3 | — |
| | | HARDNESS 2 | PRESENT | WORKER 3 | — |
| | | | | HEAT TREATMENT QUALITY 3 | — |

FIG. 5

| PROCESS | | ENVIRONMENT | | RECEPTION | | HEAT TREATMENT | | CLEANING | | PRESS FITTING | | WELDING | |
|---|---|---|---|---|---|---|---|---|---|---|---|---|---|
| METHOD b | — | TEMPERATURE 1 | — | MATERIAL: ROD 2 | PRESENT | TEMPERATURE 3 | — | SOLUTION CLEANING DEGREE 4 | — | LOAD 5 | — | DIMENSIONS 6 | PRESENT |
| FACILITY b | — | HUMIDITY 1 | — | COMPONENT 2 | PRESENT | COOLING RATE 3 | — | OIL AMOUNT 4 | PRESENT | PRESSING AMOUNT 5 | — | MOLTEN POOL SHAPE 6 | PRESENT |
| CONDITION b | PRESENT | AIR VOLUME 1 | — | DIMENSION 2 | — | ATMOSPHERE 3 | — | DEVICE OPERATION 4 | — | OIL AMOUNT 5 | PRESENT | MOLTEN POOL LIGHT EMISSION 6 | PRESENT |
| | | | | CLEANING DEGREE 2 | — | DEVICE OPERATION 3 | — | WORKER 4 | — | DIMENSIONS 5 | — | OPTICAL SYSTEM 6 | PRESENT |
| | | | | HARDNESS 2 | — | WORKER 3 | — | CLEANING QUALITY 4 | — | DEVICE OPERATION 5 | PRESENT | OIL AMOUNT 6 | PRESENT |
| | | | | | | HEAT TREATMENT QUALITY 3 | — | | | WORKER 5 | PRESENT | DEVICE OPERATION 6 | PRESENT |
| | | | | | | | | | | PRESS FITTING QUALITY 5 | PRESENT | WORKER 6 | PRESENT |
| | | | | | | | | | | | | WELDING QUALITY 6 | — |

FIG. 6

| PROCESS | ENVIRONMENT | | RECEPTION | | HEAT TREATMENT | | CLEANING | | PRESS FITTING | | WELDING | |
|---|---|---|---|---|---|---|---|---|---|---|---|---|
| METHOD b | TEMPERATURE 1 | — | MATERIAL ROD 2 | — | TEMPERATURE 3 | — | SOLUTION CLEANING DEGREE 4 | PRESENT | LOAD 5 | — | DIMENSION 6 | — |
| FACILITY b | HUMIDITY 1 | PRESENT | COMPONENT 2 | — | COOLING RATE 3 | — | OIL AMOUNT 4 | PRESENT | PRESSING AMOUNT 5 | — | MOLTEN POOL SHAPE 6 | — |
| CONDITION b | AIR VOLUME 1 | — | DIMENSION 2 | — | ATMOSPHERE 3 | — | DEVICE OPERATION 4 | — | OIL AMOUNT 5 | PRESENT | MOLTEN POOL LIGHT-EMISSION 6 | PRESENT |
| | | | CLEANING DEGREE 2 | — | DEVICE OPERATION 3 | — | WORKER 4 | PRESENT | DIMENSION 5 | — | OPTICAL SYSTEM 6 | — |
| | | | HARDNESS 2 | — | WORKER 3 | — | CLEANING QUALITY 4 | — | DEVICE OPERATION 5 | PRESENT | OIL AMOUNT 6 | PRESENT |
| | | | | | HEAT TREATMENT QUALITY 3 | — | | | WORKER 5 | PRESENT | DEVICE OPERATION 6 | — |
| | | | | | | | | | PRESS FITTING QUALITY 5 | — | WORKER 6 | PRESENT |
| | | | | | | | | | | | WELDING QUALITY 6 | — |

| ○ PART A | RISK |
|---|---|
| DIMENSION OF EDGE | PRESS FITTING DEFECT, IT CAN BE GAP OF WELDING GROOVE |
| ○ HEAT TREATMENT | |
| POSITION OF FURNACE | HEAT TREATMENT TEMPERATURE MAY VARY |
| ○ CLEANING | |
| CLEANING TIME | OIL AMOUNT REMAINS IN SHORT-TIME CLEANING |
| ○ WELDING | |
| SHIELD GAS TARGET POSITION | ENTRAINMENT OF ATMOSPHERIC AIR, OXIDATION |
| EXHAUST DUCT FLOW RATE | DEPOSITION/FILLING OF FUME |

QUALITY CONTROL DEVICE AND QUALITY CONTROL METHOD

TECHNICAL FIELD

The present invention relates to technology of a quality control device and a quality control method used in a production system.

BACKGROUND ART

According to a recent social situation, a manufacturing environment greatly changes. For example, due to an increase in overseas production, an increase in procurement items from overseas, a decrease in skilled engineers, and the like, it become difficult to maintain manufacturing technology. Therefore, product quality control is exposed to more severe situations.

Conventional quality control is to obtain a constant quality by determining control items in each process and advancing manufacturing according to the control items. However, even if the manufacturing is advanced according to the control items, it is difficult to completely eliminate defects and a large amount of defects may occur suddenly. This is because there are control items which are not considered in a conventional quality control method or items in which a relation is not always clear, and a relation between the quality and the control items is insufficient.

On the other hand, a movement to use information technology (IT) and big data for manufacturing becomes active. In addition, efforts of quality control using IT and big data are seen As a method of solving the problems in the conventional quality control, there is technology described in PTL 1. PTL 1 discloses "a production quality system includes a measurement information collection unit 15 for collecting and storing a physical quantity to be measured in producing a product by a production facility 13 with the facility number of the production facility and the production date and time, on the basis of manufacturing instruction information 12 from a manufacturing instruction system 11. Further, the production quality system includes a quality information analysis unit 22 having a function for setting a control limit on the basis of a reference value and upper and lower limit values to be calculated by a statistical method from the physical quantity stored in the past when the product is correctly produced, and for determining the presence or absence of abnormality of the production facility 13 according to whether or not the physical quantity to be measured in real time from the production facility 13 enters the control limit. In addition, an analysis result from the quality information analysis unit 22 including the presence or absence of the abnormality of the production facility 13 is output to an output unit 28 and is displayed by the output unit 28." (refer to Abstract).

CITATION LIST

Patent Literature

PTL 1: JP 2009-80649 A

SUMMARY OF INVENTION

Technical Problem

However, in the method of PTL 1, it is possible to identify the process and the period in which the defect has occurred. However, it is still difficult to obtain a cause of the defect and guidance on how to take measures in the future.

The present invention has been made in view of the above background and an object thereof is to realize stable quality control.

Solution to Problem

In order to solve the above problems, in the present invention, a quality control device includes an input unit which receives an operation condition of each device for producing a product; a calculation unit which assigns a value of the operation condition to a correlation formula set in advance and calculates a value derived from the correlation formula; and an output unit which outputs a result of performing good or bad determination on a quality of a process in the device for producing the product, on the basis of a result calculated by the calculation unit.

Other solutions will be described in embodiments.

Advantageous Effects of Invention

According to the present invention, stable quality control can be performed.

BRIEF DESCRIPTION OF DRAWINGS

FIG. 3 is a diagram showing a configuration example of product data used in the first embodiment FIG. 4 is a diagram showing data necessary for confirmation of hardness after heat treatment.

FIG. 5 is a diagram showing data necessary for confirmation of a penetration depth.

FIG. 6 is a diagram showing data necessary for confirmation of an occurrence probability of a blow hole to be poor welding.

DESCRIPTION OF EMBODIMENTS

Next, modes (referred to as "embodiments") for carrying out the present invention will be described in detail with reference to the drawings as appropriate.

First Embodiment (System Configuration)

Figure 1:
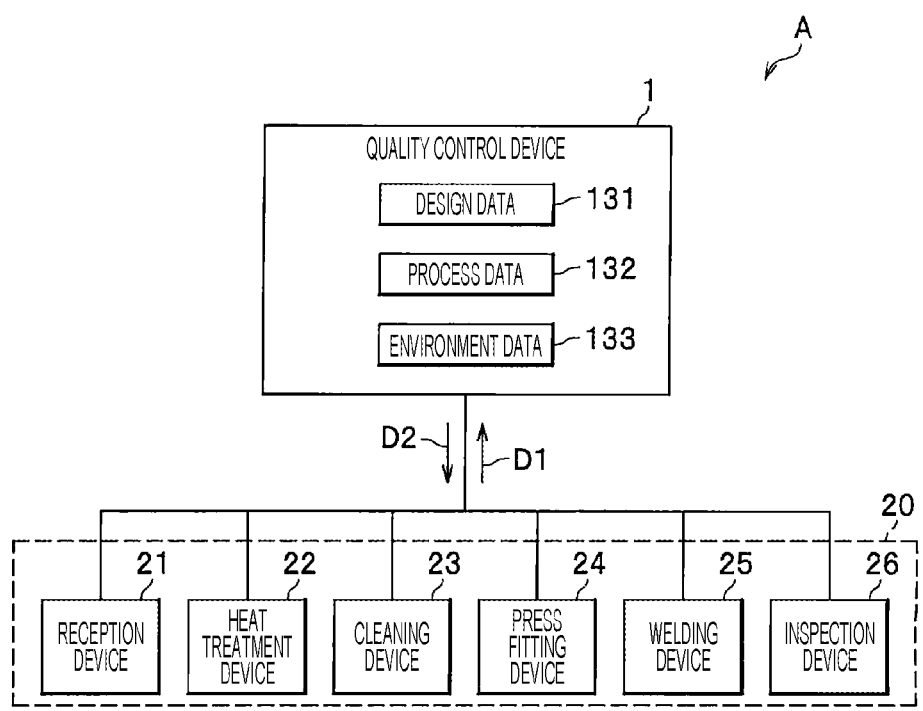
FIG. 1 is a diagram showing an entire configuration example of a quality control system used in a first embodiment.

FIG. 1 is a diagram showing an entire configuration example of a quality control system used in the present embodiment.

A quality control system A has a quality control device 1 and a production system 20. The quality control device 1 is installed in a data center not shown in the drawings, for example.

The production system 20 has a reception device 21, a heat treatment device 22, a cleaning device 23, a press fitting device 24, a welding device 25, and an inspection device 26 to be devices for producing a product.

That is, a production process performed in the production system 20 starts from reception (reception process) of two material rods by the reception device 21. After a heat treatment (heat treatment process) by the heat treatment device 22, a cleaning process by the cleaning device 23 is performed. Then, the press fitting device 24 press-fits a workpiece (press fitting process) and the welding device 25 performs joining by laser welding (welding process), so that the product is produced. The produced product is shipped after the inspection device 26 inspects the product (inspection process). Here, the workpiece refers to the material rod from the heat treatment process to the welding process. Incidentally, the workpiece for which the welding process has been completed becomes the "product".

Further, design data 131, process data 132, environment data 133, and the like are stored in the quality control device 1.

The design data 131 stores design information of the product input by a user.

The process data 132 stores information acquired in the production process of the product.

The environment data 133 stores information regarding a production environment of the product.

The design data 131, the process data 132, and the environment data 133 will be described later.

Data D1 is sent from the devices 21 to 26 of the production system 20 to the quality control device 1. In addition, the quality control device 1 performs good or bad determination on a work result in a specific process, on the basis of the sent data D1. When "bad" is determined as a result of the good or bad determination, the quality control device 1 calculates an appropriate operation condition D2 as necessary and sets the operation condition D2 to each of the devices 21 to 26 of the production system 20.

(Quality Control Device)

Figure 2:
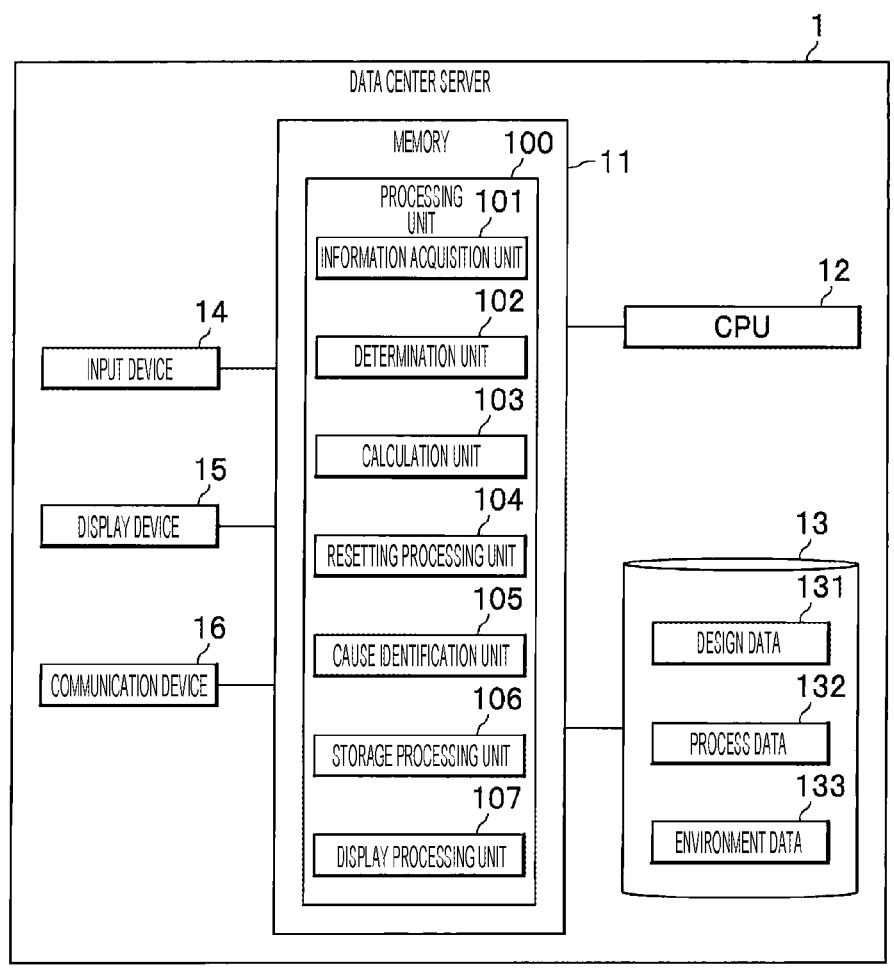
FIG. 2 is a diagram showing a hardware configuration of a quality control device used in the first embodiment.

FIG. 2 is a diagram showing a hardware configuration of the quality control device used in the present embodiment.

The quality control device 1 has a memory 11, a central processing unit (CPU) 12, a storage device 13, an input device 14, a display device (display unit) 15, and a communication device (input unit) 16.

The memory 11 is constituted by a random access memory (RAM) or the like.

The storage device 13 is constituted by a hard disk (HD) or the like, and stores the design data 131, the process data 132, and the environment data 133. The design data 131, the process data 132, and the environment data 133 will be described later.

The input device 14 is a keyboard, a mouse, or the like.

The display device 15 is a display or the like.

The communication device 16 communicates with each of the devices 21 to 26 (refer to FIG. 1) in the production system 20.

A program stored in the storage device 13 is loaded into the memory 11 and the loaded program is executed by the CPU 12, so that a processing unit 100 and an information acquisition unit 101, a determination unit 102, a calculation unit (correlation formula update unit) 103, a resetting processing unit (condition change unit) 104, a cause identification unit 105, a storage processing unit 106, and a display processing unit (output unit) 107 constituting the processing unit 100 are embodied.

The information acquisition unit 101 acquires various data from the devices 21 to 26 (refer to FIG. 1) in the production system 20.

The determination unit 102 performs a determination processing.

The calculation unit 103 performs calculation processing.

In the case where it is predicted that a value is deviated, the resetting processing unit 104 performs resetting processing for searching how to change the operation condition or the like when the operation condition or the like is changed and changing the operation condition or the like according to a search result.

In the case where the value is deviated despite the resetting processing in the resetting processing unit 104, the cause identification unit 105 identifies a cause thereof.

The storage processing unit 106 stores a calculation result by the calculation unit 103, the data acquired by the information acquisition unit 101, and the like in the storage device 13.

The display processing unit 107 displays various display screens on the display device 15.

The processing performed by the respective units 101 to 107 will be described later.

(Product Data)

FIG. 3 is a diagram showing a configuration example of product data used in the present embodiment. FIG. 1 is appropriately referred to.

Product data 130 shown in FIG. 3 is obtained by combining the design data 131, the process data 132, and the environment data 133 of FIGS. 1 and 2. The product data 130 shown in FIG. 3 is an example and the present invention is not limited to this format.

Further, the product data 130 shown in FIG. 3 is data regarding a "product A", for example. The same product data 130 exists for each product.

The product data 130 broadly has items of "design", "environment", and "process". Here, the item of "design" corresponds to the design data 131 of FIGS. 1 and 2, the item of "environment" corresponds to the environment data 133 of FIGS. 1 and 2, and the item of "process" corresponds to the process data 132 of FIGS. 1 and 2.

The item of "design" further has items of "design" and "process".

The "design" has items such as "drawing a", "part a", "dimension a", "material a", "tolerance a", "specification a", and "production process a".

The "drawing a" stores a drawing name, a drawing ID, and the like. The "part a" stores a name of the part (material rod), a part ID (material rod ID), and the like. The "dimension a" stores a part dimension. The "material a" stores a material name, a material ID, and the like. The "tolerance a" stores tolerance for the part dimension. The "specification a" stores information regarding the specification of the corresponding part. The "production process a" stores a process ID and the like of the process in which the corresponding part is produced. The information input to each item of the "design" is information input by the user.

The "process" has items such as "method b", "facility b", and "condition b".

The "method b" stores information (a method name, a method ID, and the like) regarding a method to be used. The "facility b" stores a name of a facility to be used, a facility ID, and the like. The "condition b" stores information regarding welding conditions. The information stored in the "condition b" is, for example, a laser output, a welding speed, a focal position, and the like. The welding speed is a movement speed of a workpiece or a movement speed of a laser when welding is performed. The focal position is a focal position of the laser. The information input to each item of the "process" is information input by the user. In the present embodiment, the "welding condition" refers to the condition included in the "condition b" and the "operation condition" indicates each condition included in the product data 130, including the "welding condition".

The "environment" has items such as "temperature 1", "humidity 1", and "air volume 1".

The "temperature 1" stores an air temperature when a series of processes is performed. If a series of processes is performed outdoors, an outside air temperature is stored in the "temperature 1", and if a series of processes is performed indoors, an indoor temperature is stored in the "temperature 1". The "humidity 1" stores a humidity when a series of processes is performed. If a series of processes is performed outdoors, an outdoor humidity is stored in the "humidity 1", and if a series of processes is performed indoors, an indoor humidity is stored in the "humidity 1". The "air volume 1" indicates an air volume when a series of processes is performed outdoors. When a series of processes is performed indoors, "0" is stored in the "air volume 1". The information input to each item of the "environment" may be input by the user or may be input from a temperature sensor, a humidity sensor, and an air flow sensor not shown in the drawings.

The "process" has items such as "reception", "heat treatment", "cleaning", "press fitting", "welding", and "inspection (quality)". Among these items, the "reception" stores data regarding the reception device 21. Similarly, the "heat treatment" stores data regarding the heat treatment device 22 and the "cleaning" stores data regarding the cleaning device 23. In addition, the "press fitting" stores data regarding the press fitting device 24, the "welding" stores data regarding the welding device 25, and the "inspection (quality)" stores data regarding the inspection device 26.

The "reception" has items such as "material rod 2", "component 2", "dimension 2", "cleaning degree 2", and "hardness 2".

The "material rod 2" stores a rod number and the like of the material rod to be received. The "component 2" stores information regarding a component of the material rod. This component is an amount of carbon measured by emission spectroscopy or the like, a content of sulfur, and the like. The "dimension 2" stores a dimension of the material rod to be received. This dimension is obtained by performing measurement for a predetermined place by a laser displacement meter or the like. The "cleaning degree 2" stores information indicating how much the material rod to be input is cleaned. Specifically, the "cleaning degree 2" is information represented by an amount of oil adhering to a surface of the material rod, and indicates that, when the amount of oil adhering to the surface of the material rod is smaller, a cleaning degree is higher (cleaning is well performed). The "cleaning degree 2" is obtained by evaluating the amount of oil by Fourier transform infrared spectroscopy or the like.

The "hardness 2" stores hardness of the material rod to be input. The "hardness 2" stores a value measured by a Vickers hardness meter or the like.

The "heat treatment" has items such as "temperature 3", "cooling rate 3", "atmosphere 3", "device operation 3", "worker 3", and "heat treatment quality 3".

The "temperature 3" stores a temperature of the heat applied to the workpiece in the heat treatment process. The "temperature 3" is measured by using a thermography, a thermocouple, or the like. The "cooling rate 3" stores a cooling rate in a cooling process after the heat is applied. The "cooling rate 3" is calculated by the quality control device 1 on the basis of the temperature measured by the thermography, the thermocouple, or the like. The "atmosphere 3" stores, for example, an oxygen concentration in the heat treatment. The oxygen concentration is measured by an oximeter or the like. The "device operation 3" stores information such as when the heat treatment device 22 is turned on and turned off, the number of workpieces processed, and the like. In the "worker 3", a name of a worker who has performed the heat treatment work by operating the heat treatment device 22, a worker ID, and the like are stored on the basis of a worker shift and the like. The "heat treatment quality 3" stores a result of a visual appearance inspection, the hardness of the workpiece after the heat treatment measured by the Vickers hardness meter, and the like.

The "cleaning" has items such as "solution cleaning degree 4", "oil amount 4", "device operation 4", "worker 4", and "cleaning quality 4".

The "solution cleaning degree 4" is a contamination amount of a cleaning solution. That is, the "solution cleaning degree 4" is a contamination state of the solution for cleaning the workpiece. Specifically, the "solution cleaning degree 4" is measured by the Fourier transform infrared spectroscopy. Incidentally, the cleaning solution is used until it becomes dirty to some extent. The "oil amount 4" is an amount of oil adhering to the workpiece before cleaning, and is measured by the Fourier transform infrared spectroscopy, for example. The "device operation 4" stores information such as when the cleaning device 23 is turned on and turned off, the number of workpieces processed, and the like. In the "worker 4", a name of a worker who has performed the cleaning treatment work by operating the cleaning device 23, a worker ID, and the like are stored on the basis of a worker shift and the like. The "cleaning quality 4" is a surface oil amount of the workpiece after cleaning. For example, the "cleaning quality 4" is stored by measuring the surface oil amount of the workpiece by the Fourier transform infrared spectroscopy.

The "press fitting" has items of "load 5", "pressing amount 5", "oil amount 5", "dimension 5", "device operation 5", "worker 5", and "press fitting quality 5".

The "load 5" stores the force applied to the workpiece in the press fitting process. The "pressing amount 5" stores an amount indicating how much the workpiece has been press-fitted as a result of applying a load. The "oil amount 5" stores an oil amount of a workpiece surface before the press fitting process is performed. For example, the oil amount is measured by the Fourier transform infrared spectroscopy and is stored. The "dimension 5" stores dimensions of two workpieces after the press fitting treatment. The "device operation 5" stores information such as when the press fitting device 24 is turned on and turned off, the number of workpieces processed, and the like. In the "worker 5", a name of a worker who has performed the press fitting treatment work by operating the press fitting device 24, a worker ID, and the like are stored on the basis of a worker shift and the like. The "press fitting quality 5" stores a result of press fitting position/pressing by a visual observation. Specifically, a pressing amount and the like are stored in the "press fitting quality 5".

The "welding" has items of "dimension 6", "molten pool shape 6", "molten pool light emission 6", "optical system 6", "oil amount 6", "device operation 6", "worker 6", and "welding quality 6".

The "dimension 6" stores a gap amount of a welding portion and the like. The "molten pool shape 6" stores a length of a molten pool. The length of the molten pool is calculated on the basis of an image of a camera or is measured by a displacement measurement laser. Here, the length of the molten pool is, for example, a largest length or the like in the molten pool. The "molten pool light emission 6" stores a light emission intensity (for example, infrared light intensity) of the molten pool. The light emission intensity is measured by a photodiode or the like. The "optical system 6" stores a temperature rise value of protective glass measured by the thermography or the like. The "oil amount 6" stores an oil amount of the workpiece surface before the welding process is performed. The "device operation 6" stores information such as when the welding device 25 is turned on and turned off, the number of workpieces processed, and the like. In the "worker 6", a name of a worker who has performed the press fitting treatment work by operating the welding device 25, a worker ID, and the like are stored on the basis of a worker shift and the like. The "welding quality 6" stores an evaluation of internal defects by a visual appearance observation and a cross-sectional observation.

The "inspection (quality)" has items of "performance 7", "visual observation 7", "shape 7", "device operation 7", and "worker 7".

The "performance 7" stores a tensile strength of a product generated from a plurality of workpieces as a result of welding and a result of shape measurement by laser measurement. The "visual observation 7" stores a visual inspection result (good or bad determination result) and the like. The "shape 7" stores each dimension of the product after welding. This dimension is measured by a laser displacement meter or the like. The "device operation 7" stores information such as when the inspection device 26 is turned on and turned off, the number of products processed, and the like. In the "worker 7", a name of a worker who has performed the heat treatment work by operating the inspection device 26, a worker ID, and the like are stored on the basis of a worker shift and the like.

FIG. 4 is a diagram showing data necessary for confirmation of hardness after the heat treatment.

In FIG. 4, items shown by "present" are data having a correlation with the hardness after the heat treatment. The presence or absence of the correlation is calculated in advance on the basis of a contribution rate and the like. Each item in FIG. 4 corresponds to the item of the same name in FIG. 3. The same is applicable to FIGS. 5 and 6 to be described later.

As shown in FIG. 4, there is no environment data 133 affecting the hardness after the heat treatment. For these items, if the hardness after the heat treatment for confirmation is calculated by a multiple regression line, the following formula (1) is obtained. The hardness after the heat treatment for confirmation is to confirm whether or not the workpiece has the predetermined hardness after the heat treatment process ends.

$$\text{Hardness after heat treatment for confirmation} = 0.147 \times (\text{material rod 2}) + 10.752 \times (\text{component 2}) + 3.558 \times (\text{cleaning degree 2}) + 0.8777 \times (\text{hardness 2}) + 0.0025 \times (\text{temperature 3}) + 0.678 \times (\text{cooling rate 3}) + 20.557 \times (\text{atmosphere 3}) + 107.589 \quad (1)$$

Variables "material rod 2", "component 2", "cleaning degree 2", "hardness 2", "temperature 3", "cooling rate 3", "atmosphere 3", and the like in each formula are described with reference to FIG. 3. Therefore, the description is omitted here. Similarly, in the following formulas (2) to (6) to be described later, the description of the variables is omitted.

In the heat treatment process, the hardness after the heat treatment becomes a quality of the heat treatment process. However, a defined value is not satisfied and a defect may occur. In the first embodiment, the hardness of the workpiece after the heat treatment is performed can be estimated by the formula (1).

As a result, it can be examined in advance whether or not the predetermined hardness is obtained, when the heat treatment is performed on the workpiece before the heat treatment process under any operation condition. In addition, a result of the examination can be reflected in the operation condition of the heat treatment process.

As described above, a predetermined heat treatment quality can be obtained by using a multiple regression formula obtained from the acquired data.

Similarly, the hardness after the heat treatment for prediction can be calculated by the following formula (2). The hardness after the heat treatment for prediction is to predict the hardness after the heat treatment from the data acquired in the process performed in the past, before the heat treatment is performed.

$$\text{Hardness after heat treatment for prediction} = 0.147 \times (\text{material rod 2}) + 10.752 \times (\text{component 2}) + 3.558 \times (\text{cleaning degree 2}) + 0.8777 \times (\text{hardness 2}) \quad (2)$$

FIG. 5 is a diagram showing data necessary for confirmation of a penetration depth.

The penetration depth is a penetration depth of a welding portion after the welding process ends. The penetration depth is an indicator of a welding quality in the welding process.

FIG. 5 shows a result of performing correlation analysis for the penetration depth to be the welding quality and each data.

In FIG. 5, items shown by "present" are items having a correlation with the penetration depth. For these items, if the penetration depth for confirmation is represented by a multiple regression formula, the following formula (3) is obtained. The penetration depth for confirmation is to confirm whether or not the penetration depth of the workpiece becomes a predetermined depth, after the welding process ends.

$$\text{Penetration depth for confirmation} = 0.0635 \times (\text{condition b-laser output}) - 0.275 \times (\text{condition b-welding speed}) - 0.366 \times (\text{condition b-focal position}) + 0.00047 \times (\text{material rod 2}) + 0.157 \times (\text{component 2}) + 0.0087 \times (\text{oil amount 4}) + 0.00014 \times (\text{cleaning quality 4}) + 0.00011 \times (\text{oil amount 5}) + 0.0002 \times (\text{worker 5}) + 0.052 \times (\text{press fitting quality 5}) + 1.25 \times (\text{dimension 6}) + 0.789 \times (\text{molten pool shape 6}) + 0.114 \times (\text{molten pool light emission 6}) - 0.034 \times (\text{optical system 6}) + 0.0074 \times (\text{oil amount 6}) + 0.0635 \times (\text{device operation 6}) + 0.00088 \times (\text{worker 6}) + 0.0257 \quad (3)$$

By using the formula (3), it can be examined in advance whether or not the predetermined penetration depth is obtained, when welding is performed on the workpiece before the welding process under any operation condition. In addition, a result of the examination can be reflected in the operation condition.

Similarly, the penetration depth for prediction can be calculated by the following formula (4). The penetration depth for prediction is to predict the penetration depth from the data acquired in the process performed in the past, before the welding is performed.

$$\text{Penetration depth for prediction} = 0.0635 \times (\text{condition b-laser output}) - 0.275 \times (\text{condition b-welding speed}) - 0.366 \times (\text{condition b-focal position}) + 0.00047 \times (\text{material rod 2}) + 0.157 \times (\text{component 2}) + 0.0087 \times (\text{oil amount 4}) + 0.00014 \times (\text{cleaning quality 4}) + 0.00011 \times (\text{oil amount 5}) + 0.0002 \times (\text{worker 5}) + 0.052 \times (\text{press fitting quality 5}) \quad (4)$$

FIG. 6 is a diagram showing data necessary for confirmation of an occurrence probability of a blow hole to be poor welding.

The blow hole occurrence probability is a blow hole occurrence probability after the welding process ends. The presence or absence of the blow hole is a welding quality.

FIG. 6 shows a result of performing correlation analysis for the blow hole occurrence probability to be the welding quality and each data.

In FIG. 6, items shown by "present" are items having a correlation with the blow hole occurrence probability. For these items, if the blow hole occurrence probability for confirmation is represented by a multiple regression formula, the following formula (5) is obtained. The blow hole occurrence probability for confirmation is to confirm what rate the blow hole of the workpiece occurs at, after the welding process ends.

$$\text{Blow hole occurrence probability for confirmation} = 0.00012 \times (\text{condition b-laser output}) + 0.052 \times (\text{condition b-speed}) - 0.127 \times (\text{condition b-focal position}) + 1.523 \times (\text{humidity 1}) + 7.556 \times (\text{solution cleaning degree 4}) + 15.274 \times (\text{oil amount 4}) + 0.0257 \times (\text{worker 4}) + 20.753 \times (\text{cleaning quality 4}) + 13.221 \times (\text{oil amount 5}) + 0.0035 \times (\text{worker 5}) + 0.578 \times (\text{molten pool light emission 6}) + 4.887 \times (\text{oil amount 6}) + 0.00145 \times (\text{worker 6}) + 3.478 \quad (5)$$

The easiness of occurrence of the blow hole can be evaluated from the formula (5) of the blow hole occurrence probability for confirmation. By using the formula (5), it can be understood that, if the welding is performed on the workpiece before the welding process under any operation conditions, the blow hole occurrence probability can be decreased.

Similarly, the blow hole occurrence probability for prediction can be calculated by the following formula (6). The blow hole occurrence probability for prediction is to predict the blow hole occurrence probability from the data acquired in the process performed in the past, before the welding is performed.

$$\text{Blow hole occurrence probability for prediction}(\%) = 0.00012 \times (\text{condition b-laser output}) + 0.052 \times (\text{condition b-speed}) - 0.127 \times (\text{condition b-focal position}) + 1.523 \times (\text{humidity 1}) + 7.556 \times (\text{solution cleaning degree 4}) + 15.274 \times (\text{oil amount 4}) + 0.0257 \times (\text{worker 4}) + 20.753 \times (\text{cleaning quality 4}) + 13.221 \times (\text{oil amount 5}) + 0.0035 \times (\text{worker 5}) \quad (6)$$

Further, the formula (6) can be calculated during the welding process. Therefore, the quality control device 1 calculates the blow hole occurrence probability during the welding process, so that the operation conditions can be adjusted.

(Flowchart)

Figure 7:
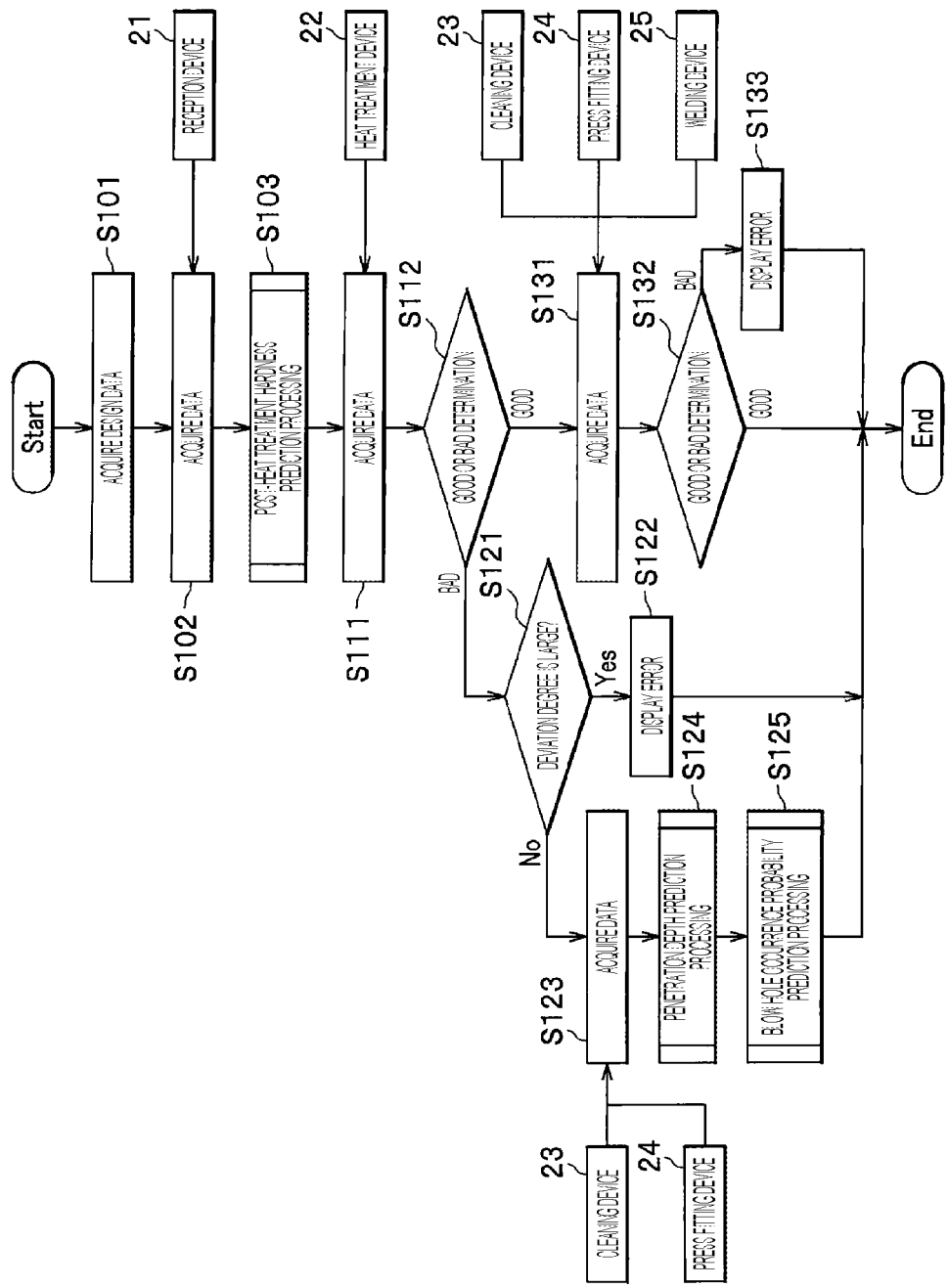
FIG. 7 is a flowchart showing a processing procedure of the quality control device used in the first embodiment.

FIG. 7 is a flowchart showing a processing procedure of the quality control device used in the first embodiment. FIGS. 1 and 2 are appropriately referred to.

First, the information acquisition unit 101 acquires the design data 131 via the input device 14 (S101). At this time, the environment data 133 is also acquired.

Next, after the reception processing, the information acquisition unit 101 acquires data from the reception device 21 before the heat treatment is performed (S102). Here, the information acquisition unit 101 may acquire only the data of the items to which "present" is given in FIGS. 4 to 6 (data acquisition in steps S111, S123, and S131 is also the same). Incidentally, the data acquired in step S102 is stored in the item of "reception" in the process data 132 of FIG. 3.

Then, the quality control device 1 performs post-heat treatment hardness prediction processing (S103). The post-heat treatment hardness prediction processing will be described later.

Next, the information acquisition unit 101 acquires data from the heat treatment device 22 (S111). The data acquired in step S111 is stored in the item of "heat treatment" in the process data 132 of FIG. 3.

Then, the determination unit 102 performs good or bad determination on the hardness after the heat treatment (quality of the heat treatment process) in the data acquired from the heat treatment device 22 (S112). In the good or bad determination, it is determined whether or not a value calculated using the data acquired in step S111 and the formula (1) by the calculation unit 103 is deviated by a predetermined value or more from a value of the hardness after the heat treatment for confirmation calculated from the formula (1) in the past. The predetermined value is, for example, whether or not it is deviated by σ. Here, σ is a value of a standard deviation.

When the determination unit 102 outputs "bad" as a result of step S112 (S112→bad), that is, the determination unit 102 determines whether or not a deviation degree is large (S121). The deviation degree is a degree to which an actual measurement value of the hardness after the heat treatment is deviated from a value shown by a correlation formula of the hardness after the heat treatment for confirmation shown by the formula (1). When it is determined that the deviation degree is large, for example, this is the case where the actual measurement value of the hardness after the heat treatment is deviated by 2σ (σ is the standard deviation) or more from the value shown by the correlation formula of the hardness after the heat treatment for confirmation shown by the formula (1).

When the determination unit 102 outputs that the deviation degree is large as a result of step S121 (S121→Yes), the display processing unit 107 displays an error on the display device 15 (S122) and ends the processing. At this time, the cause identification unit 105 may perform the same processing as step S221 of FIG. 8 and the display processing unit 107 may display a cause identification screen shown in FIG. 9.

When the determination unit 102 outputs that the deviation degree is small as the result of step S121 (S121→No), the information acquisition unit 101 waits for an end of the cleaning process and the press fitting process and acquires data from the cleaning device 23 and the press fitting device 24 (S123). The data acquired in step S123 is stored in the items of "cleaning" and "press fitting" in the process data 132 of FIG. 3.

Then, the quality control device 1 performs the penetration depth prediction processing (S124) and then performs the blow hole occurrence probability prediction processing (S125). The penetration depth prediction processing and the blow hole occurrence probability prediction processing will be described later.

Then, the quality control device 1 ends the processing.

On the other hand, when the determination unit 102 outputs "good" as the result of step S112 (S112→good), the information acquisition unit 101 waits for an end of the cleaning process, the press fitting process, and the welding process and acquires data from the cleaning device 23, the press fitting device 24, and the welding device 25 (S131). The data acquired in step S131 is stored in the items of "cleaning", "press fitting", and "welding" in the process data 132 of FIG. 3. When "good" is output as the result of step S112, the display processing unit 107 may display it on the display device 15.

Then, the determination unit 102 performs the good or bad determination on the penetration depth and the presence or absence of occurrence of the blow hole (the quality of the welding processing) in the data acquired from the welding device 25 (S132). In the good or bad determination, it is determined whether or not a value calculated using the data acquired in step S131 and the formula (3) by the calculation unit 103 is deviated by a predetermined value or more from a value of the penetration depth for confirmation calculated from the formula (3) in the past and it is determined whether or not the blow hole occurs. The predetermined value is, for example, whether or not it is deviated by σ (σ is the standard deviation).

Here, when the penetration depth is deviated by the predetermined value or more from the value shown by the correlation formula of the penetration depth for confirmation shown by the formula (3) or when the blow hole occurs, "bad" is determined in step S132.

When the penetration depth is not deviated by the predetermined value from the value shown by the correlation formula of the penetration depth for confirmation shown by the formula (3) and when the blow hole does not occur, "good" is determined in step S132.

When the determination unit 102 outputs "bad" as the result of step S132 (S132→bad), the display processing unit 107 displays an error on the display device 15 (S133) and the quality control device 1 ends the processing. At this time, the cause identification unit 105 may perform the same processing as step S221 of FIG. 8 and the display processing unit 107 may display the cause identification screen shown in FIG. 9.

When the determination unit 102 outputs "good" as the result of step S132 (S132→good), the quality control device 1 ends the processing. When "good" is output as the result of step S132, the display processing unit 107 may display it on the display device 15.

In the present embodiment, data from the inspection device 26 is not used.

Further, as described above, in steps S102, S111, S123, and S131, only the data corresponding to the items to which "present" is given in FIGS. 4 to 6 can be acquired. In this way, an amount of data to be acquired can be reduced and a storage capacity of the storage device 13 can be reduced.

(Prediction Processing)

Figure 8:
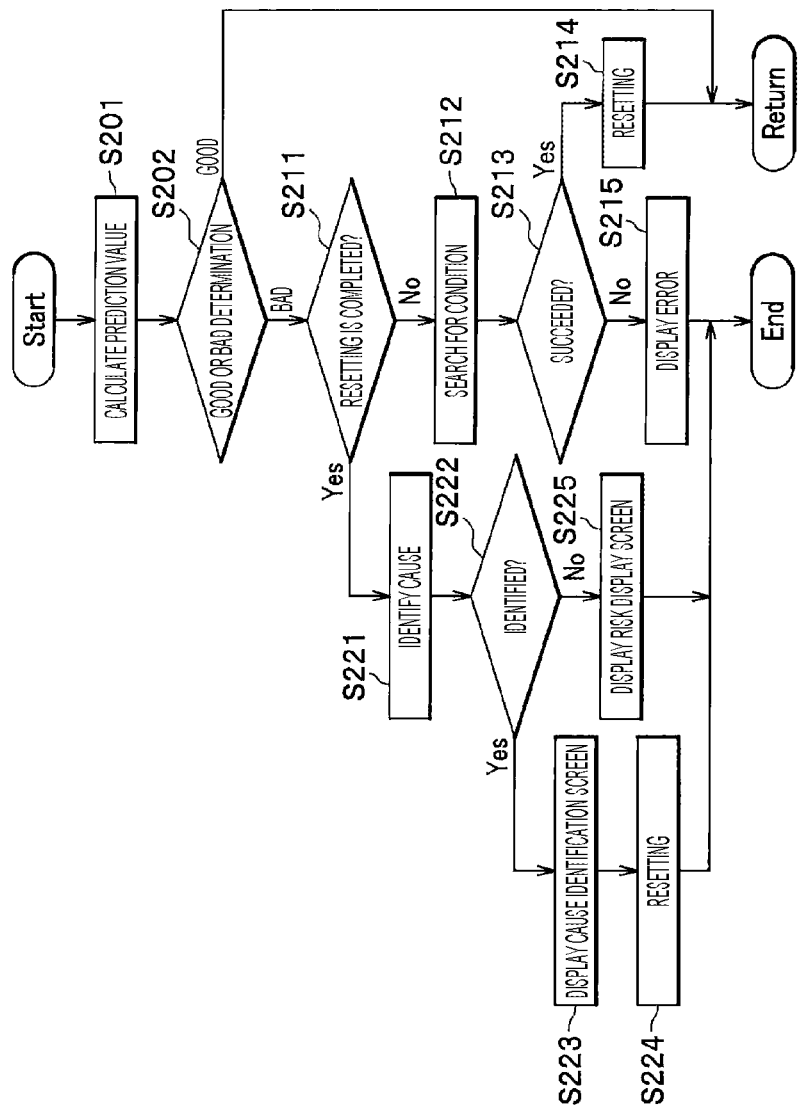
FIG. 8 is a flowchart showing a procedure of prediction processing used in the first embodiment.

FIG. 8 is a flowchart showing a procedure of prediction processing used in the present embodiment. The processing of FIG. 8 is the processing used in steps S103, S124, and S125 of FIG. 7.

First, the calculation unit 103 calculates a prediction value (S201). The prediction value is the hardness after the heat treatment for prediction shown by the formula (2) in the case of step S103, is the penetration depth for prediction shown by the formula (4) in the case of step S124, and is the blow hole occurrence probability for prediction shown by the formula (6) in the case of step S125. At this time, each data acquired in steps S102 and S123 is used.

Next, the determination unit 102 performs the good or bad determination using each calculated prediction value (S202). In the good or bad determination, it is determined whether or not the prediction value calculated in step S201 is deviated by a predetermined value from an average value of actual measurement values obtained from the past history. That is, the good or bad determination is performed on the quality predicted in the heat treatment process or the welding process. The predetermined value is, for example, whether or not it is deviated by σ (σ is the standard deviation).

As a result of step S202, when "good" is determined (S202→good), the quality control device 1 returns to the processing of FIG. 7.

As the result of step S202, when "bad" is determined (S202→bad), the determination unit 102 determines whether or not the value has been reset before (resetting has been completed) (S211). The resetting of the value is processing to be described later in step S214.

As a result of step S211, when the resetting is not performed (S211→No), the resetting processing unit 104 performs condition search for searching for a value of each operation condition (S212). In the condition search, the resetting processing unit 104 changes each operation condition (variable) of the used correlation formula so that the prediction value becomes an appropriate value. Here, a desired value is an average value of actual measurement values obtained from the past history. In this case, it is considered that the operation condition, in particular, the welding condition ("condition b" of FIG. 3) is set to a different value. This state often occurs when welding of one product is switched to welding of another product.

For example, when the prediction value of the blow hole occurrence probability becomes a large value, the welding conditions such as the laser output, the welding speed, and the focal position can be adjusted as the operation conditions. However, if these operation conditions are changed, the penetration depth also changes. That is, since the formula of the penetration depth for prediction shown by the formula (4) and the formula of the blow hole occurrence probability for prediction shown by the formula (6) have many common variables, attempting to lower the blow hole occurrence probability also affects the penetration depth. Therefore, the resetting processing unit 104 can search for the operation condition establishing both sides by simultaneously evaluating both sides with the formula of the penetration depth for prediction. That is, the resetting processing unit 104 searches for the operation condition to be balanced in the formula (6) of the blow hole occurrence probability for prediction and the formula (4) of the penetration depth for prediction. That is, when a value of the operation condition is changed in each correlation formula, the resetting processing unit 104 searches for a value having the least influence in the other correlation formulas.

At this time, the resetting processing unit 104 slightly changes the value of each operation condition and calculates each prediction value using the slightly changed operation condition and the formulas (4) and (6). Then, if the value is not the desired value, the resetting processing unit 104 changes the value of each operation condition and searches for a value of the operation condition where changes of the prediction value of the penetration depth and the prediction value of the blow hole occurrence probability are smallest. In this way, when a defect ("bad") is determined as the result of the good or bad determination in step S202, the resetting processing unit 104 changes the value of the operation condition so that the value of the quality determined as the defect becomes an appropriate quality value.

Conversely, if the prediction value of the penetration depth changes, another prediction value, specifically, the prediction value of the blow hole occurrence probability may change. For example, since the "condition b-laser output" is also used in the correlation formula of the blow hole occurrence probability for prediction, changing the "condition b-laser output" also changes the prediction value of the blow hole occurrence probability. The same is applicable to the other operation conditions.

Among the operation conditions in the product data 130 of FIG. 3, an operation condition in which setting is freely changed is the welding condition ("condition b"). Therefore, here, it is assumed that the welding condition is changed. However, the condition to be changed is not limited to the welding condition. If there is an operation condition in which setting can be changed, a value of the operation condition may be changed.

In this way, the process quality can be properly maintained and an influence on the other processes can be minimally suppressed.

Then, the determination unit 102 determines whether or not a combination of operation conditions where each prediction value falls within the desired value as the result of step S212 has been found (succeeded) (S213).

As a result of step S213, when the combination of operation conditions where each prediction value falls within the desired value has been found (succeeded) (S213→Yes), the resetting processing unit 104 resets the value of the found operation condition (S214).

As the result of step S213, when the combination of operation conditions where each prediction value falls within the desired value has not been found (failed) (S213→No), the display processing unit 107 performs error display of "welding non-permission" on the display device 15 (S215) and ends the processing. The worker finds the cause.

As the result of step S211, when the resetting is performed (S211→Yes), the cause identification unit 105 identifies the cause of the determination of "defect" in step S202 (S221). For example, the cause identification unit 105 performs comparison with the values in the past with respect to the elements constituting the correlation formula of the prediction value and detects elements of which values are deviated by a predetermined distance from an average value of the values in the past. The elements constituting the correlation formula of the prediction value are "material rod 2", "component 2", "cleaning degree 2", and "hardness 2", in the case of the prediction formula (formula (2)) of the heat treatment hardness for prediction.

In this way, when a defect ("bad") is determined as the result of the good or bad determination in step S202 even though the value of the operation condition is changed, the cause identification unit 105 identifies the operation unit that is the cause of the determination of the defect.

Then, the cause identification unit 105 determines whether or not the cause of the "defect" has been identified (S222).

As a result of step S222, when the cause of the "defect" has been identified (S222→Yes), the display processing unit 107 displays the cause identification screen on the display device 15 (S223).

Figures 9, 10:
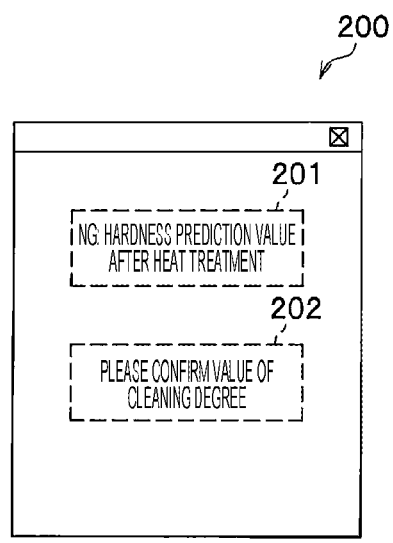
FIG. 9 is a diagram showing an example of a cause identification screen used in the first embodiment.
FIG. 10 shows an example of a risk display screen used in the first embodiment.

FIG. 9 is a diagram showing an example of the cause identification screen used in the first embodiment.

A cause identification screen 200 shown in FIG. 9 is a screen displayed on the display device 15 by the processing displayed in step S223 of FIG. 8.

The cause identification screen 200 has a defect information display region 201 and a cause display region 202.

In the defect information display region 201, information regarding the value determined as "defect" in step S202 is displayed. In the example of FIG. 9, it is displayed that defect determination is performed in "hardness prediction value after heat treatment".

In the cause display region 202, information regarding the cause identified in step S221 is displayed. In the example of FIG. 9, since the value of "cleaning degree 2" in the formula (2) is abnormal, display for urging confirmation of "cleaning degree" is performed.

In this way, when the workpiece is determined as "defect", the user can narrow down and investigate the cause.

The description returns to the description of FIG. 8.

After step S222, the user reviews the value of the operation condition according to the cause identification screen 200 shown in FIG. 9 and resets the operation condition (S224).

As the result of step S222, when the cause cannot be identified (S222→No), the display processing unit 107 displays a risk display screen on the display device 15 (S225).

Further, when the defect cannot be suppressed even if the operation condition is adjusted on the basis of the result obtained from the correlation formula (S211→Yes), a place other than the data to be currently managed may be the cause.

Therefore, the display processing unit 107 displays, on the display device 15, a risk display screen in which conditions not stored in the product data 130 of FIG. 3 and risks related to the conditions are associated with each other (S225). That is, when a defect ("bad") is determined as the result of the good or bad determination in step S202 even though the value of the operation condition is changed, the display processing unit 107 displays the risk display screen on the display device 15.

FIG. 10 shows an example of the risk display screen used in the present embodiment.

In a risk display screen 300 supported by FIG. 10, an example of risk display displayed when the blow hole occurs is shown.

For example, when the blow hole occurs even though the welding condition is adjusted in step S214, the blow hole occurs in the welding process, so that risk data up to the welding process in the risk data is displayed. In this way, items not to be currently measured are listed and are displayed together with the related risks, so that this can be useful for investigating the cause.

In the list of risks displayed in FIG. 10, the user previously lists up items not measured in the design data 131, the environment data 133, and the process data 132 and assigns the risks to the respective items. That is, the list of risks displayed in FIG. 10 is a list of conditions not included in the operation conditions of the product data 130.

In FIG. 10, only things related to those in which defects have occurred in the list are displayed. For example, in the example of FIG. 10, things related to the blow hole in the created list are displayed. It is previously set by the user which item is to be displayed when what kind of defect occurs.

In the risk display screen 300, the risks related to the defects having occurred actually in the past may be displayed.

In this way, even if the prediction value of the workpiece quality is determined as a defect due to factors other than the operation conditions stored in the product data 130, it is possible to cope with it.

The description returns to the description of FIG. 8.

After step S225, the user checks the value of each device with reference to the risk display screen shown in FIG. 10.

(Correlation Coefficient Calculation Processing)

Figure 11:
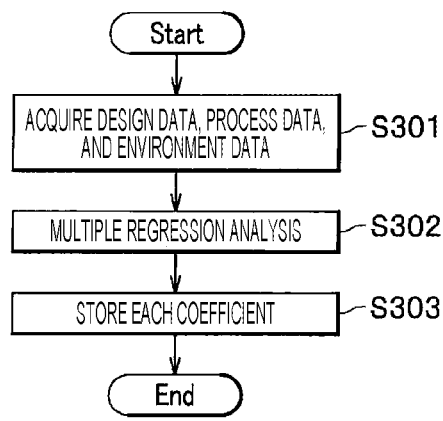
FIG. 11 is a flowchart showing a procedure of correlation coefficient setting processing used in the first embodiment.

FIG. 11 is a flowchart showing a procedure of correlation coefficient setting processing used in the first embodiment.

The processing shown in FIG. 11 is processing performed offline, that is, during a stop of the production system 20. Further, FIG. 11 shows processing to be regularly performed.

First, the information acquisition unit 101 acquires all of the design data 131, the process data 132, and the environment data 133 accumulated in the past (S301).

Then, the calculation unit 103 performs multiple regression analysis using the data acquired in step S301 (S302). As a result, the coefficients of the formulas (1) to (6) are calculated.

Then, the storage processing unit 106 stores the coefficients calculated in step S302 in the storage device 13 (S303).

In this way, the correlation formula is updated.

Since the process data 132 is sequentially accumulated, accuracy of the correlation formula can be improved by performing the processing shown in FIG. 11. The processing shown in FIG. 11 is preferably performed regularly.

According to the first embodiment, the values of the operation conditions can be adjusted to stable values by analyzing the correlation of the values of the operation conditions in each process with respect to the hardness after heat treatment, the penetration depth, and the blow hole occurrence probability. As a result, it is possible to stabilize the quality of the product from a long-term perspective.

That is, according to the first embodiment, as in the formulas (1) to (6), it is possible to confirm whether or not a predetermined process quality is obtained, by using the regression formula obtained by performing the multiple regression analysis using data obtained in each process. As a result, the quality of the production system 20 can be stabilized.

Further, the values of the operation conditions actually acquired from the respective devices 21 to 26 in the product system 20 are used, so that the stability of the quality can be improved while the product system 20 is operated.

Further, as in the formulas (2), (4), and (6), by using the correlation formulas predicting the quality of the heat treatment process and the welding process, the quality can be predicted before the heat treatment process and the welding process, and the operation conditions can be adjusted in advance.

The processing of steps S212 to S215 in FIG. 8 may be performed immediately after "bad" is determined in steps S112 and S132. In this case, the correlation formulas to be processed become the correlation formulas for confirmation in the formulas (1), (3), and (5).

Second Embodiment

Next, a second embodiment of the present invention will be described with reference to FIG. 12.

Figure 12:
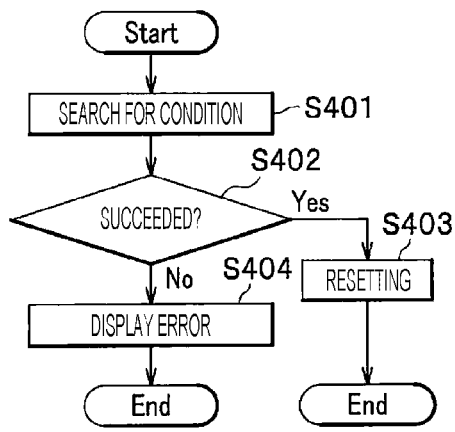
FIG. 12 is a flowchart showing a procedure of operation condition change processing used in a second embodiment.

FIG. 12 is a flowchart showing a procedure of operation condition change processing used in the second embodiment.

The processing of FIG. 12 is processing performed offline, that is, while a production management system 20 does not operate. Since processing of steps S401 to S404 in FIG. 12 are the same as the processing of steps S212 to S215 in FIG. 8, the description of each processing is omitted here.

According to the second embodiment, since the processing is performed offline, an influence on the production system 20 can be reduced.

When the processing shown in FIG. 12 is performed, the processing of steps S212 to S215 in FIG. 8 may be performed or may not be performed.

Before the processing of step S401 in FIG. 12, it is determined whether or not there is an outlier in the history of actual values for hardness after heat treatment, a penetration depth, and the presence or absence of a blow hole, and when there is the outlier, the processing of steps S401 to S404 may be performed on the value where the outlier has occurred.

Third Embodiment

In the first and second embodiments, processing is performed on the basis of data obtained when a production system 20 operates. However, as shown in FIG. 13, data obtained when the production system 20 is experimentally operated (test operation) may be used.

Figure 13:
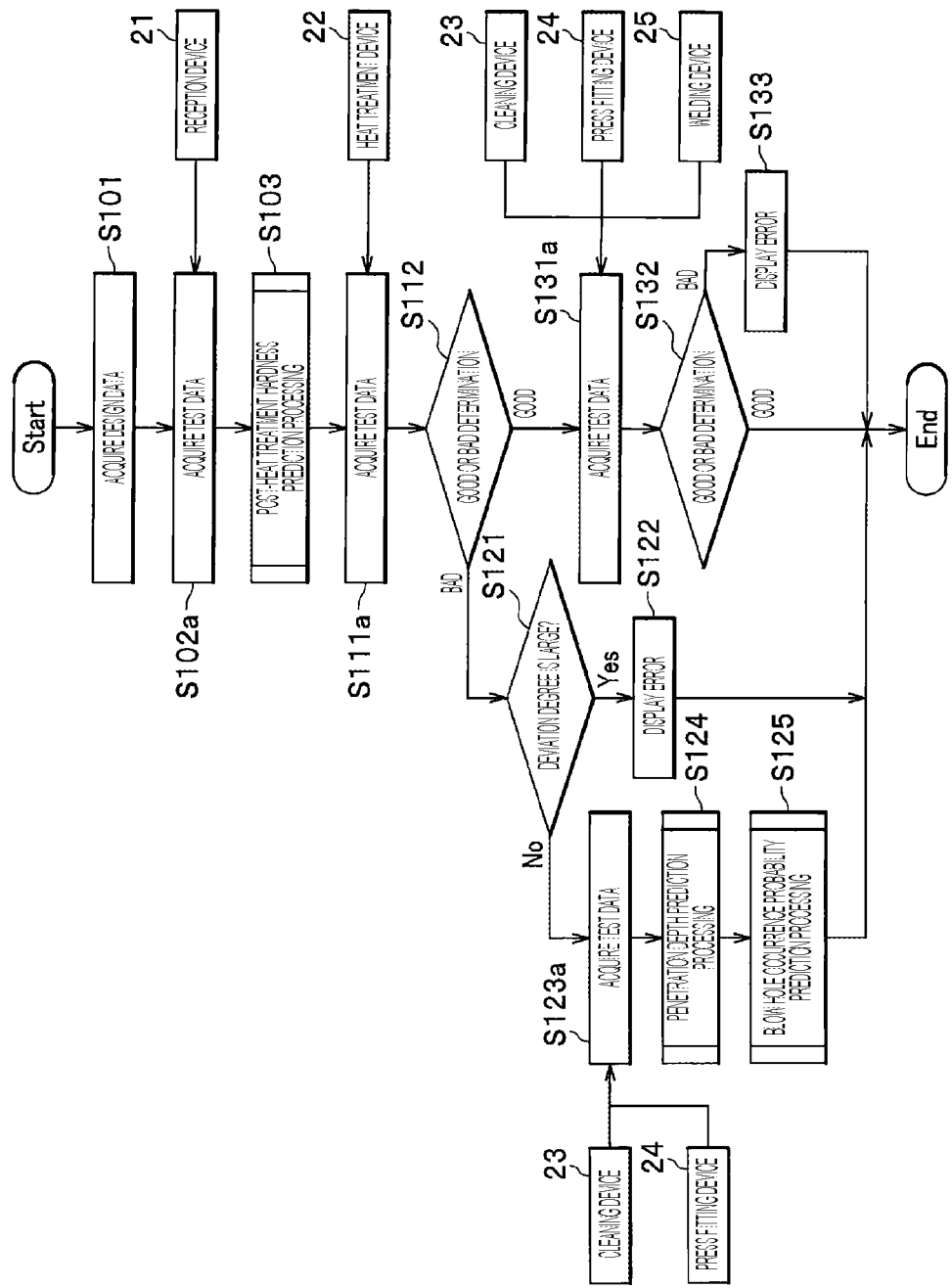
FIG. 13 is a flowchart showing a processing procedure of a quality control device used in a third embodiment.

FIG. 13 is a flowchart showing a processing procedure of a quality control device 1 used in the third embodiment.

In FIG. 13, data acquired in steps S102, S111, S123, and S131 of FIG. 7 becomes test data (S102a, S111a, S123a, and S131a).

That is, in the first embodiment, the processing is performed on the basis of data when the production system 20 actually operates, whereas in the third embodiment, the processing is performed on the basis of data (test data) when the production system 20 is tested.

Since the other processing is the same as that in the first embodiment, the description thereof is omitted here.

According to the third embodiment, when the operation of the production system 20 starts, operation conditions of the production system 20 can be already stabilized.

Not only the test data but also data described in the past literatures and the like may be input instead of a test value.

Further, a type of data and a measurement method are not limited to the examples described in each embodiment. Further, each process of the production system 20 is not limited to the example described in the present embodiment. Although each correlation formula is generated by multiple regression analysis in the present embodiment, the present invention is not limited to this.

The present invention is not limited to the embodiments described above and various modifications are included. For example, the embodiments are described in detail to facilitate the understanding of the present invention and are not limited to including all of the described configurations. Further, a part of the configurations of the certain embodiment can be replaced by the configurations of other embodiments or the configurations of other embodiments can be added to the configurations of the certain embodiment. Further, for a part of the configurations of the individual embodiments, addition of other configurations, configuration removal, and configuration replacement can be performed.

Further, although not described in the present embodiment, the quality control device 1 may have functions of performing pre-processing, creation of a database, and statistical processing with respect to acquired data. In this way, since the acquired data can be used as the database, it is possible to enhance traceability. For example, traceability after product shipment can be increased by storing the product data 130 in association with a product ID.

Further, a part or all of the individual configurations, functions, units 100 to 107, and the storage device 13 may be designed by integrated circuits, for example, and may be realized by hardware. Further, as shown in FIG. 2, the individual configurations and functions may be realized by software by analyzing and executing programs for realizing the respective functions by a processor such as the CPU 12. Information such as the programs, the tables, and the files for realizing the individual functions can be stored in a recording device such as a memory and a solid state drive (SSD) or a recording medium such as an integrated circuit (IC) card, a secure digital (SD) card, and a digital versatile disc (DVD), in addition to the HD.

Further, in the embodiments, only control lines or information lines necessary for explanation are shown and the control lines or information lines do not mean all control lines or information lines necessary for a product. In actuality, almost all configurations may be mutually connected.

REFERENCE SIGNS LIST

1 quality control device
13 storage device
14 input device
15 display device (display unit)
16 communication device (input unit)
20 production system
100 processing unit
101 information acquisition unit
102 determination unit
103 calculation unit (correlation formula update unit)
104 resetting processing unit (condition change unit)
105 cause identification unit
106 storage processing unit
107 display processing unit (output unit)
130 product data
131 design data
132 process data
133 environment data

The invention claimed is:

1. A quality control device, comprising:
a communication interface configured to receive an operation condition of each device for producing a product;
a processor configured to assign a value of the operation condition to a correlation formula set in advance and to calculate a value derived from the correlation formula; and
a display processor configured to output a result of performing a first or second determination on a quality of a process in the device for producing the product, on the basis of a result calculated by the processor, such that the device produces the product,
the processor configured to change the value of the operation condition so that a value of the quality determined as a defect becomes an appropriate quality value, when the defect of the quality is determined as the result of the first or second determination, wherein
the processor, when the value of the operation condition is changed in each of a plurality of correlation formulas, searches for a value having the least influence in other correlation formulas of the plurality of correlation formulas, and
the display processor is configured to cause a risk screen to be displayed when a cause of the defect cannot be identified, the display screen displaying possible causes for the defect and associating risks for possible causes with each other, the display screen displaying listed risks including conditions not included in the operation condition.

2. The quality control device according to claim 1, wherein
the value of the operation condition includes a value acquired from each device.

3. The quality control device according to claim 1, wherein
the value of the operation condition is information obtained in a test operation of each device.

4. The quality control device according to claim 1, wherein the processor is configured to update the correlation formula, on the basis of a newly acquired value.

5. The quality control device according to claim 1, wherein
the communication interface is configured to input the value of the operation condition used in the correlation formula.

6. The quality control device according to claim 1, wherein the processor is configured to change the value of the operation condition so that a value determined as a defect as the result of the first or second determination becomes an appropriate value, during a non-operation of each device for producing the product.

7. The quality control device according to claim 1, wherein
the correlation formula predicts a quality of a process corresponding to the correlation formula by using the value of the operation condition in a process before the process corresponding to the correlation formula.

8. A quality control method, comprising
causing a quality control device which controls a quality of a production in a process of producing the product to:
receive an operation condition of each device for producing the product via an input;
assign a value of the operation condition to a correlation formula set in advance;
calculate a value derived from the correlation formula; and
output a result of performing a first or second determination on a quality of a process in the device for producing the product, on the basis of a result of the calculation such that the device produces the product, wherein the quality control device is configured to:
change the value of the operation condition so that a value of the quality determined as a defect becomes an appropriate quality value, when the defect of the quality is determined as the result of the first or second determination, and
when the value of the operation condition is changed in each of a plurality of correlation formulas, search for a value having the least influence in other correlation formulas of the plurality of correlation formulas, and
display a risk screen when a cause of the defect cannot be identified, the display screen displaying possible causes for the defect and associating risks for possible causes with each other, the display screen displaying listed risks including conditions not included in the operation condition.

9. The quality control method of claim 8, wherein the correlation formula includes a penetration depth of a workpiece.

* * * * *